(12) United States Patent
Trujillo et al.

(10) Patent No.: US 8,877,571 B2
(45) Date of Patent: Nov. 4, 2014

(54) ELECTRONIC DISPLAY TEST DEVICE AND RELATED METHOD

(75) Inventors: Jovan Trujillo, Phoenix, AZ (US); Curtis Moyer, Phoenix, AZ (US)

(73) Assignee: Arizona Board of Regents, a Body Corporate of the State of Arizona Acting for and on Behalf of Arizona State University, Scottsdale, AZ (US)

( * ) Notice: Subject to any disclaimer, the term of this patent is extended or adjusted under 35 U.S.C. 154(b) by 126 days.

(21) Appl. No.: 13/313,284

(22) Filed: Dec. 7, 2011

(65) Prior Publication Data

US 2012/0097961 A1 Apr. 26, 2012

Related U.S. Application Data

(63) Continuation of application No. PCT/US2010/035983, filed on May 24, 2010.

(60) Provisional application No. 61/185,500, filed on Jun. 9, 2009.

(51) Int. Cl.
*H01L 21/00* (2006.01)

(52) U.S. Cl.
USPC ............ 438/158; 257/E21.414; 257/E29.291; 205/124

(58) Field of Classification Search
CPC ...... H01L 21/336; H01L 29/786; C25D 7/12; C25D 3/02; C25D 5/02
USPC ............ 257/60, E21.414, E29.291; 438/158; 205/124
See application file for complete search history.

(56) References Cited

U.S. PATENT DOCUMENTS

| | | | | |
|---|---|---|---|---|
| 4,045,302 A | | 8/1977 | Gibbs et al. | |
| 4,843,438 A | * | 6/1989 | Koden et al. | 257/59 |
| 5,202,274 A | * | 4/1993 | Bae et al. | 438/585 |
| 5,648,146 A | * | 7/1997 | Gotou et al. | 428/209 |
| 5,650,358 A | * | 7/1997 | Gu et al. | 438/30 |
| 5,872,370 A | * | 2/1999 | Gu et al. | 257/66 |
| 5,970,326 A | * | 10/1999 | Lawley et al. | 438/158 |
| 6,037,713 A | * | 3/2000 | Fukuta et al. | 313/582 |
| 6,184,960 B1 | * | 2/2001 | Sawayama et al. | 349/139 |
| 6,808,963 B2 | * | 10/2004 | Ishida et al. | 438/149 |
| 6,888,160 B1 | * | 5/2005 | Nakajima et al. | 257/59 |
| 6,967,118 B2 | * | 11/2005 | Weng et al. | 438/29 |
| 7,341,924 B2 | * | 3/2008 | Takayama et al. | 438/455 |
| 7,442,587 B2 | | 10/2008 | Amundson et al. | |
| 7,446,836 B2 | * | 11/2008 | Kurashima | 349/114 |
| 7,749,396 B2 | * | 7/2010 | Chow et al. | 216/13 |
| 7,768,013 B2 | * | 8/2010 | Kim et al. | 257/60 |

(Continued)

FOREIGN PATENT DOCUMENTS

JP 10-074953 3/1998

OTHER PUBLICATIONS

The International Search Report and Written Opinion from corresponding Int'l Application No. PCT/US10/035983 dated Feb. 25, 2011.

(Continued)

*Primary Examiner* — Caleb Henry
(74) *Attorney, Agent, or Firm* — Bryan Cave LLP (57) ABSTRACT

Methods of anodizing aluminum using a hard mask and related embodiments of semiconductor devices are disclosed herein. Other methods and related embodiments are also disclosed herein.

16 Claims, 8 Drawing Sheets

(56) References Cited

U.S. PATENT DOCUMENTS

2003/0228715 A1* 12/2003 Brody et al. .................... 438/30
2004/0159546 A1* 8/2004 Zhang et al. ............. 204/403.01
2005/0130391 A1* 6/2005 Takayama et al. ............ 438/458
2006/0114380 A1* 6/2006 Kurashima .................... 349/114
2007/0013035 A1* 1/2007 Joshi ............................ 257/635

OTHER PUBLICATIONS

The International Preliminary Report on Patentability from corresponding Int'l Application No. PCT/US10/035983 dated Dec. 22, 2011.

* cited by examiner

ELECTRONIC DISPLAY TEST DEVICE AND RELATED METHOD

CLAIM OF PRIORITY

This application is a continuation of PCT Application No. PCT/US2010/035983, filed May 24, 2010, which claims the benefit of U.S. Provisional Patent Application No. 61/185,500, filed Jun. 9, 2009.

STATEMENT REGARDING FEDERALLY SPONSORED RESEARCH OR DEVELOPMENT

The U.S. Government has a paid-up license in this invention and the right in limited circumstances to require the patent owner to license to others on reasonable terms as provided by the terms of Grant/Contract No. W911NF-04-2-0005 by the Army Research Lab (ARL).

FIELD OF THE INVENTION

This invention relates generally to processing semiconductor devices, and relates more particularly to a method of anodizing a metal layer using a hard mask and the semiconductor devices having such a layer.

BACKGROUND OF THE INVENTION

In the electronics industry, flexible substrates are quickly becoming popular as a base for electronic circuits. Flexible substrates can include a wide variety of materials, such as, for example, any of a myriad of plastics. Once a desired component, circuit, or circuits are formed over a surface of the flexible substrate, the flexible substrate can be attached to a final product or incorporated into a further structure. Typical examples of such products or structures are active matrices on flat panel displays, RFID (radio-frequency identification) tags on various commercial products in retail stores, a variety of sensors, etc.

Semiconductor devices processed over flexible substrates are processed at temperatures lower than semiconductor devices processed on traditional substrates. Therefore, a need exists in the art to develop methods for fabricating semiconductor devices on flexible substrates that allows for improved characteristics of the semiconductor devices, while allowing for processing of the semiconductor devices at lower temperatures.

BRIEF DESCRIPTION OF THE DRAWINGS

To facilitate further description of the embodiments, the following drawings are provided in which.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein.

The terms "couple," "coupled," "couples," "coupling," and the like should be broadly understood and refer to connecting two or more elements or signals, electrically, mechanically and/or otherwise. Two or more electrical elements may be electrically coupled together but not be mechanically or otherwise coupled together; two or more mechanical elements may be mechanically coupled together, but not be electrically or otherwise coupled together; two or more electrical elements may be mechanically coupled together, but not be electrically or otherwise coupled together. Coupling may be for any length of time, e.g., permanent or semi-permanent or only for an instant.

An electrical "coupling" and the like should be broadly understood and include coupling involving any electrical signal, whether a power signal, a data signal, and/or other types or combinations of electrical signals. A mechanical "coupling" and the like should be broadly understood and include mechanical coupling of all types. The absence of the word "removably," "removable," and the like near the word "coupled," and the like does not mean that the coupling, etc. in question is or is not removable.

DETAILED DESCRIPTION

Some embodiments include a method of providing a semiconductor device. The method can include: (a) providing a substrate, where the substrate is flexible; (b) depositing a metal layer over the substrate; (c) depositing a hard mask layer over the metal layer; (d) anodizing the metal layer after depositing the hard mask layer; and (e) providing one or more semiconductor elements.

In another embodiment, a method of providing a semiconductor device includes: (a) providing a substrate, where the substrate is flexible; (b) providing at least one bus line over the substrate; (c) providing at least one address line over the substrate; (d) providing at least one gate over the substrate; (e) providing a hard mask layer over the at least one bus line and a portion of the at least one address line; (f) placing the substrate in an electrolyte solution; (g) applying a current to the at least one bus line; (h) forming an anodization layer over the at least one gate and a portion of the at least one address line; and (i) providing at least one semiconductor element.

Other embodiments include a semiconductor device. The semiconductor device can include: (a) a substrate, where the substrate is flexible; (b) at least one gate over the substrate; (c) at least one address line over the substrate; (d) an anodization layer over the at least one gate and a portion of the at least one address line; (e) an active layer over anodization layer located over the at least one gate; and (f) a source-drain metal layer.

Figure 1:
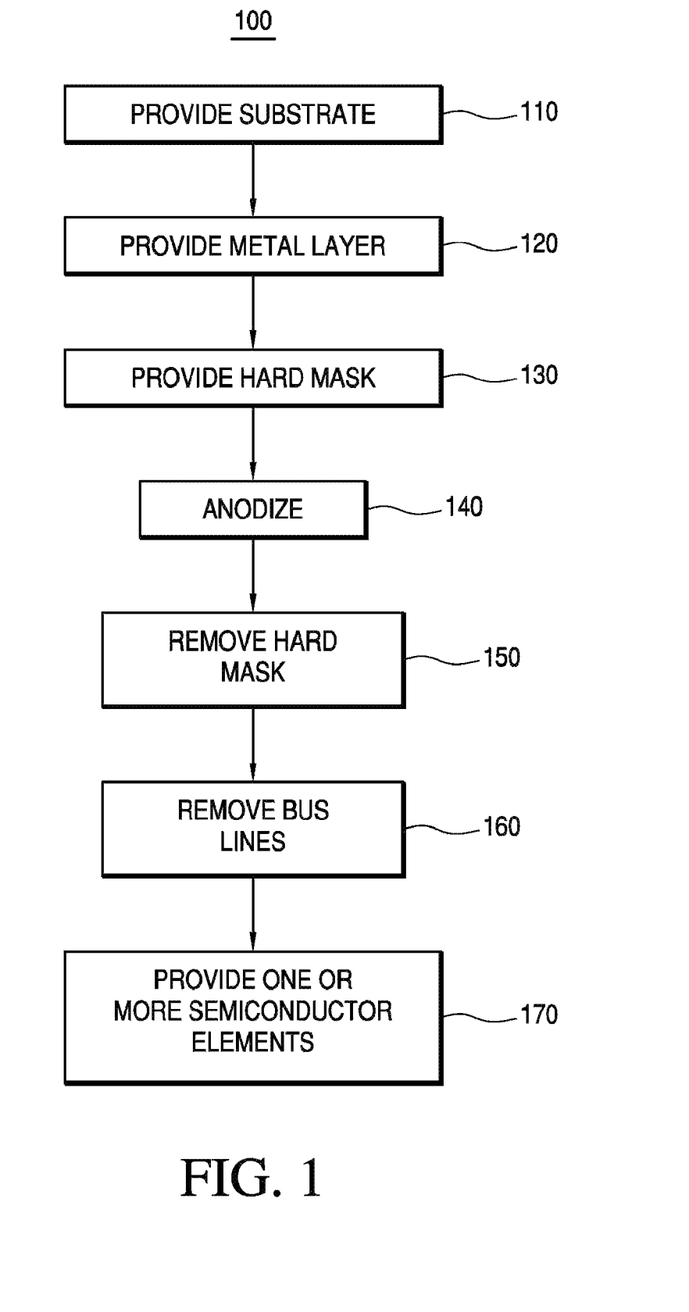
FIG. 1 illustrates an example of a method of providing a semiconductor device, according to a first embodiment.

Turning to the drawings, FIG. 1 illustrates an example of a method 100 of providing a semiconductor device according to a first embodiment. In the same or different embodiments, method 100 can be considered a method of using an anodized metal as a gate dielectric in a semiconductor device. Method 100 can also be considered a method of patterning anodized aluminum using a hard mask for use as a gate dielectric in a semiconductor device. Method 100 is merely exemplary and is not limited to the embodiments presented herein. Method 100 can be employed in many different embodiments or examples not specifically depicted or described herein.

Figure 2:
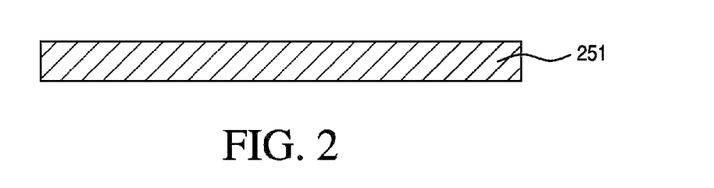
FIG. 2 illustrates a cross-sectional view of an example of a substrate, according to the first embodiment.

Method 100 includes a procedure 110 of providing a substrate. FIG. 2 illustrates a cross-sectional view of an example of substrate 251, according to the first embodiment. In some embodiments, procedure 110 of FIG. 1 can include providing a substrate that comprises a material that is generally non-reactive to anodization. In some examples, procedure 110 of FIG. 1 comprises providing a substrates that comprises silicon, display grade glass, plastic, or other materials that contain an insubstantial amount of impurities than can ionize in the electric field of the anodization tank. For example, procedure 110 of FIG. 1 can include providing a substrate that comprises silicon. In other examples, procedure 110 of FIG. 1 can include providing a flexible substrate. In many examples, the flexible substrate is a plastic substrate. For example, flexible substrates can include polyethylene naphthalate (PEN), polyethylene terephthalate (PET), polyethersulfone (PES), polyimide, polycarbonate, cyclic olefin copolymer, or liquid crystal polymer.

The thickness of the plastic substrate can be in the range of approximately 25 micrometers (μm) to approximately 300 μm. In the same or different embodiments, the thickness of the plastic substrate can be in the range of approximately 100 μm to approximately 200 μm. In various embodiments, the plastic substrate can be a PEN substrate from Teijin DuPont Films of Tokyo, Japan, sold under the tradename planarized "Teonex® Q65."

In the same or different embodiments, the substrate can be coupled to a carrier to provide rigidity and to support the substrate. In various embodiments, the carrier includes at least one of the following: alumina ($Al_2O_3$), silicon, glass, steel, sapphire, barium borosilicate, soda lime silicate, alkali silicates, or other materials. In some examples, the carrier includes comprises a material that is generally non-reactive to anodization. The carrier can be coupled to the substrate using an adhesive or by other similar means.

As an example, the carrier could comprise sapphire having a thickness between approximately 0.7 millimeters (mm) and approximately 1.1 mm. The carrier could also include 96% alumina with a thickness between approximately 0.7 mm and approximately 1.1 mm. In a different embodiment, the thickness of the 96% alumina is approximately 2.0 mm. In another example, the carrier could be single crystal silicon with a thickness of at least approximately 0.65 mm. In still a further embodiment, the carrier substrate could be stainless steel with a thickness of at least approximately 0.5 mm. The stainless steel carrier could also comprise a non-reactive barrier film coating the stainless steel to isolate the stainless steel from the anodization circuit In some examples, the carrier is slightly larger than the substrate.

In some embodiments, the substrate can be cleaned to remove any particles on the substrate. In other embodiments, the substrate does not need to be cleaned. In some embodiments, the substrate can be cleaned to removal any adhesives on the substrate. For example, if the substrate is stainless steel, the substrate can be washed with hexanes for approximately twenty seconds while spinning at approximately 1,000 rpm (revolutions per minute). In some examples, the edge of the substrate is sprayed with hexanes for the last ten seconds. Afterwards, the substrate is spun at approximately 3,000 rpm for approximately twenty seconds to dry the substrate. In some examples, the substrate can be baked for approximately sixty seconds at approximately 105 degrees Celsius (° C.) to further dry the substrate.

To remove large particles on the substrate, the substrate can be scrubbed. For example, if the substrate is stainless steel, the substrate can be scrubbed with soap and water (e.g., 40 milliliters (mL) of Alconox Detergent 8 mixed with one liter of water) using a sponge. Alconox Detergent 8 is manufactured by Alconox, Inc. of White Plains, N.Y.

Organics can be removed from the substrate by ashing. For example, if the substrate is stainless steel, the substrate can be ashed for approximately ninety minutes in an oxygen ($O_2$) environment at a pressure of approximately 1200 milliTorr.

Subsequently, method 100 in FIG. 1 includes a procedure 120 of providing a metal layer. Procedure 120 of providing a metal layer can include depositing a metal layer over the substrate. The metal layer can comprise any metal that can be anodized. In some examples, the metal layer can comprise a metal or alloy from a group of metals that includes valve metals. For example, the metal layer can comprise aluminum (Al), tantalum (Ta), titanium (Ti), niobium (Nb), or alloys thereof. In the same or other examples, the metal layer can comprise aluminum with approximately 1% silicon.

In various embodiments, the metal layer is deposited on the substrate using a DC sputtering tool. For example, the metal layer can be deposited onto the substrate using a KDF 744, manufactured by KDF Electronics, Inc., of Rockleigh, N.J.

Figure 3:
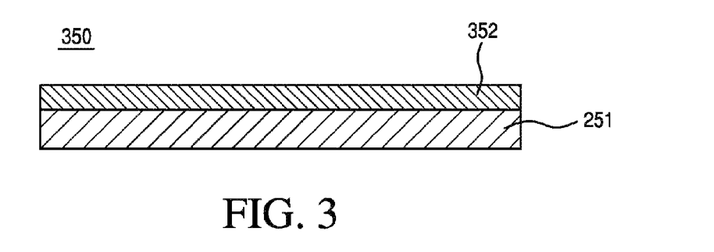
FIG. 3 illustrates a cross-sectional view of an example of a semiconductor device after depositing a metal layer, according to the first embodiment.

FIG. 3 illustrates a cross-sectional view of an example of semiconductor device 350 after depositing a metal layer, according to a first embodiment. For example, an approximately 0.15 μm thick metal layer 352 is provided over substrate 251.

Procedure 120 (FIG. 1) of providing a metal layer can also include patterning and etching the metal layer. For example, the metal layer can be patterned and etched to form bus lines, transistor gates, and/or address lines. The metal layer can be patterned using any method of patterning metal. In addition, the metal layer can be etched using any known method of etching. For example, the metal layer can be etched using an AMAT 8330, manufactured by Applied Material, Inc. of Santa Clara, Calif., after forming a patterned photoresist layer over the metal layer.

Figure 4:
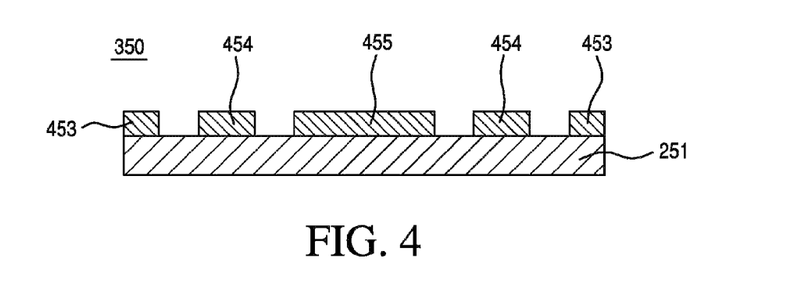
FIG. 4 illustrates a cross-sectional view of an example of the semiconductor device of FIG. 3 after patterning and etching the metal layer, according to the first embodiment.

FIG. 4 illustrates a cross-sectional view of an example of semiconductor device 350 after patterning and etching metal layer 352, according to an embodiment. For example, after the patterning and etching of metal layer 352, multiple regions of metal layer 352 remain. In some examples, bus lines 453, gate 455 and address lines 454 are formed after the patterning and etching.

Figure 5:
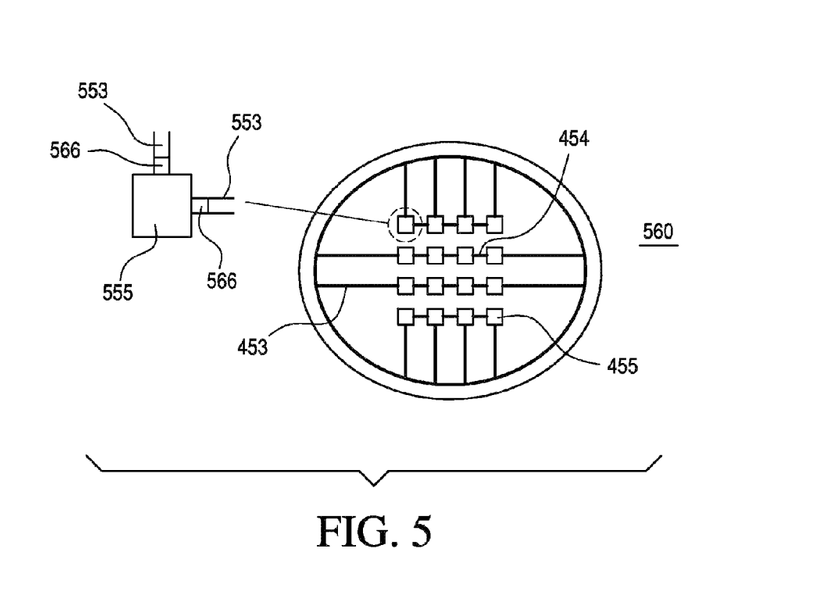
FIG. 5 illustrates a top view of an example of a wafer after providing the metal layer, according to the first embodiment.

FIG. 5 illustrates a top view of an example of a wafer 560 after procedure 120 of providing a metal layer. For example, wafer 560 comprises bus lines 453, address lines 454, and gates 455.

Next, method 100 of FIG. 1 continues with a procedure 130 of providing a hard mask. Procedure 130 can include depositing a mask layer over metal layer 352 (i.e., bus lines 453, address lines 454, and gate 455). The mask layer can comprise a material that is generally not reactive to anodization. For example, the mask layer can comprise silicon nitride. In some examples the mask layer can be hydrogenated silicon nitride with approximately 30% atomic hydrogen bonding.

Figure 6:
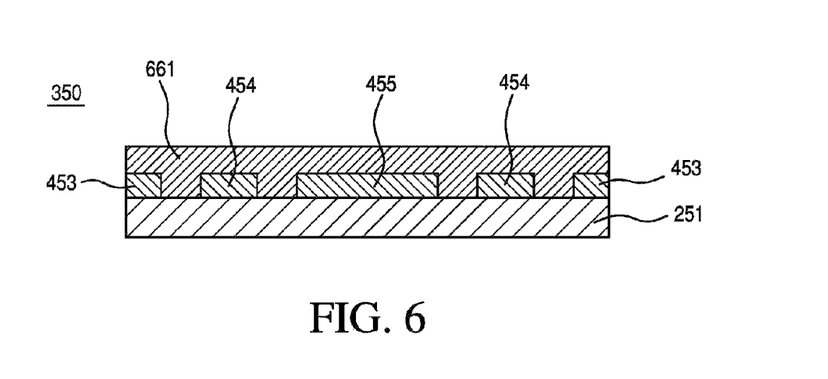
FIG. 6 illustrates a cross-sectional view of the semiconductor device of FIG. 3 after depositing a mask layer, according to the first embodiment.

In some embodiments, the mask layer can be deposited onto the semiconductor device by way of plasma-enhanced chemical vapor deposition (PECVD). For example, the mask layer can be deposited using an AMAT P5000, manufactured by Applied Material, Inc. of Santa Clara, Calif. The temperature of the depositing of the mask layer can be between approximately 180° C. and approximately 250° C. As an example, the temperature of depositing the mask layer can be between approximately 175° C. and approximately 193° C. In some examples, the thickness of the mask layer is approximately 0.30 μm. FIG. 6 illustrates a cross-sectional view of an example of semiconductor device 350 after mask layer 661 has been deposited onto semiconductor device 350, according to the first embodiment.

After the depositing of the mask layer, procedure 130 (FIG. 1) of providing the hard mask can include pattern etching the mask layer. Pattern etching the mask layer can include patterning a photoresist layer over the mask layer. Any conventional photolithography technique can be used to pattern the photoresist layer over the mask layer.

After the photoresist layer has been patterned over the mask layer, the mask layer is etched. The mask layer can be etched using any traditional etching techniques with any etchant that won't etch through the substrate. In some embodiments the mask layer is etched using conventional plasma enhanced etch tools. For example, the etching of the mask layer can include a dry-etch comprising sulfur hexafluoride (SF6), trifluoromethane ($CHF_3$), and/or tetrafluoromethane ($CF_4$).

The mask layer is patterned and etched in such a way that the areas of the underlying metal layer that are to be anodized are exposed. For example, the gates can be left exposed, thus allowing for a layer of metal oxide to be formed over the material used to form the gates. In addition, the center of the address lines can be covered with the mask layer, thus allowing the aluminum in the middle of such address lines to remain unoxidized for future formation of gate vias.

Figure 7:
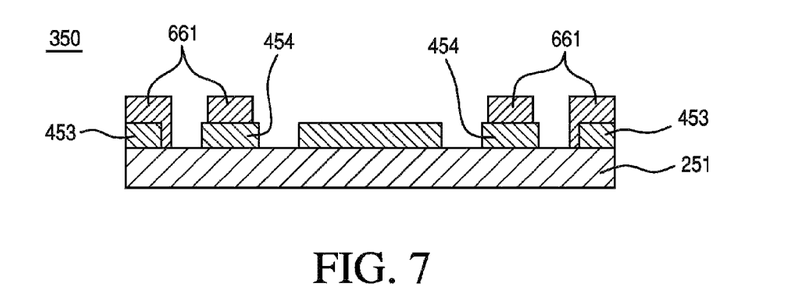
FIG. 7 illustrates a cross-sectional view of the semiconductor device of FIG. 3 after providing a hard mask, according to the first embodiment.

FIG. 7 illustrates a cross-sectional view of an example of semiconductor device 350 after providing a hard mask, according to the first embodiment. Patterned mask layer 661 covers bus lines 453 and a center portion of address lines 454.

After procedure 130, method 100 in FIG. 1 continues with a procedure 140 of anodizing the metal layer. According to some embodiments, anodizing the metal layer comprises placing the wafer in an electrolyte solution. The electrolyte solution can comprise any solution typically used for anodization. For example, the electrolytic solution can comprise a mixture of approximately 69% by weight ethylene glycol, approximately 30% by weight water, and approximately 1% by weight tartaric acid. In the same or different examples, the electrolyte solution can be buffered. For example, a 29% by volume ammonium hydroxide solution can be used to bring the electrolyte solution to a pH of approximately 7.

The wafer can be placed in the electrolyte solution vertically, with a clip attached to the wafer. The clip is placed on the wafer so that the clip is in contact with one of the bus lines. In some examples, the clip comprises platinum. In the same or different examples, the clip, when attached to the wafer, is above the level of the electrolyte solution when the wafer is placed within the electrolyte solution. A current can then be applied to the wafer to anodize the metal layer that is left exposed. In one example, an initial current of 160 milliAmps (mA) is applied to the wafer via the clip and bus lines.

Next, the voltage can be ramped up and held constant for a period of time, until the metal oxide film growth reaches an approximate steady state. In one example, the voltage is allowed to ramp up to approximately 115 volts (V), and then is held constant. The growth of the metal oxide film growth reaches approximate steady state in approximately 1 hour and 38 minutes. In this example, the metal layer comprises aluminum, and the metal oxide that is formed on the metal layer is aluminum oxide ($Al_2O_3$). In the same or different examples, the final current through the power supply is approximately 0.41 mA at 115 V. The final leakage current in the electrolyte solution is less than approximately 23 femptoamps per square micrometer ($fA/\mu m^2$) at 115 V. In the same or different examples, the wafer is a six inch diameter wafer. The aluminum oxide layer that is formed can be approximately 0.15 μm. After the anodization is complete, the wafer can then be rinsed. In some examples, the wafer is rinsed using deionized water. Next, the wafer can be dried using a spin rinse dryer.

In some examples, procedure 140 of anodizing the metal layer can be performed without removing the photoresist layer used for patterning the mask layer. In other examples, the photoresist layer used for patterning the mask layer can be removed before procedure 140.

Figure 8:
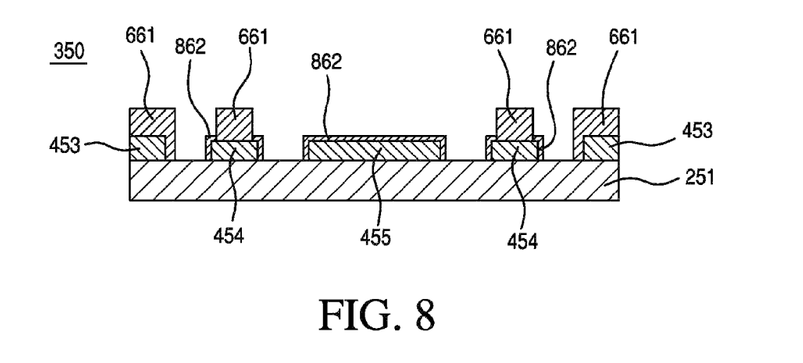
FIG. 8 illustrates a cross-sectional view of the semiconductor device of FIG. 3 after anodizing the metal layer, according to the first embodiment.

FIG. 8 illustrates a cross-sectional view of an example of semiconductor device 350 after procedure 140 (FIG. 1) of anodizing the metal layer has been performed, according to the first embodiment. Semiconductor device 350 can include an anodization layer 862 over gate 455 and portions of address lines 454. In addition, mask layer 661 is still present over semiconductor device 350.

In some embodiments, procedure 140 (FIG. 1) of anodizing can include anodizing a portion of the bus lines. The portion of the bus lines that intersects with the gates can be anodized. Anodizing this portion of the bus lines can help prevent undercutting the gates during the subsequent metal etch of procedure 160 (FIG. 1) and can help to eliminate leakage paths adjacent to the gates. For example, in the fabrication of a transistor, the subsequent metal etch of procedure 160 is followed by the deposition of an active layer. If the metal etch undercuts the anodized gates, the undercut profile of the anodized gates can trap some of the active layer, thus creating a leakage path if metal or another electrical conductor is subsequently coupled to the active layer. As an example, FIG. 5 shows a gate 555 with bus lines 553 leading into gate 555. Portions 566 of bus lines 553 leading into gate 555 or adjacent to gate 555 can also be anodized. The anodization of portions 566 of the bus lines 553 prevents undercuts from forming in gate 555 and eliminates the possible leakage paths adjacent to the gate 555.

Next, method 100 of FIG. 1 includes a procedure 150 of removing the hard mask. Procedure 150 can comprise etching the hard mask layer. Procedure 150 of removing the hard mask can be somewhat similar to or the same as the etching of the mask layer in procedure 130 of providing the hard mask. For example, the mask layer can be etched using any traditional etching techniques with any etchant that does not etch through the substrate. In some embodiments the mask layer is etched using conventional plasma enhanced etch tools. For example, the etching of the mask layer can include a dry based etch using sulfur hexafluoride (SF6), trifluoromethane (CHF$_3$), and/or tetrafluoromethane (CF$_4$).

Figure 9:
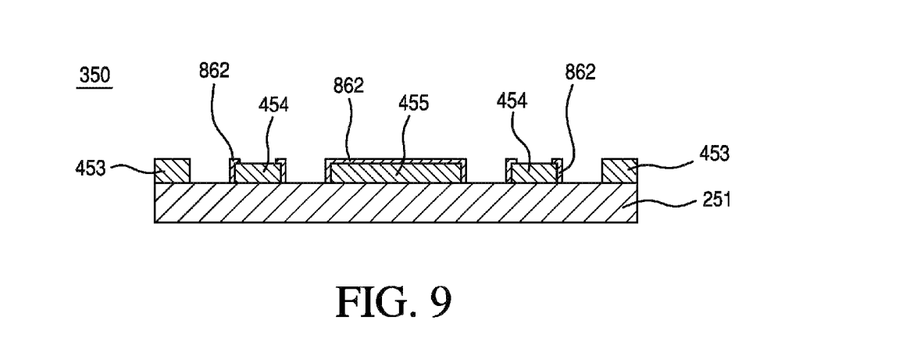
FIG. 9 illustrates a cross-sectional view of the semiconductor device of FIG. 3 after removing the hard mask, according to the first embodiment.

FIG. 9 shows a cross-sectional view of semiconductor device 350 after procedure 150 (FIG. 1) of removing the hard mask, according to the first embodiment. Bus lines 453 are now exposed. Thus, bus lines 453 can be removed in procedure 160 (FIG. 1).

Referring back to FIG. 1, method 100 includes a procedure 160 of removing the bus lines. Procedure 160 can include providing a pattern over the metal portions that are not to be etched. For example, future gate contacts can be protected. A photoresist layer can be placed over address lines to protect the future locations of gate contacts. As an example, the photoresist layer can comprises any photoresist layer used in any photolithography technique commonly used for metals.

Figure 10:
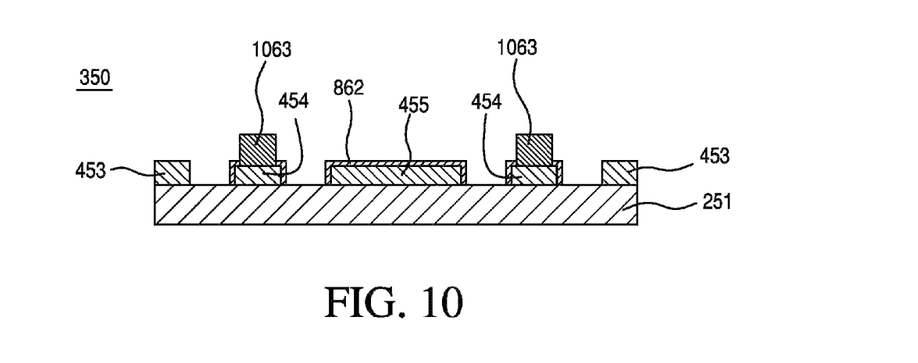
FIG. 10 illustrates a cross-sectional view of the semiconductor device of FIG. 3 after providing a mask over portions of the patterned and anodized metal layer, according to the first embodiment.

FIG. 10 shows a cross-sectional view of semiconductor device 350 after providing a mask over the metal portions, according to the first embodiment. As an example, photoresist layer 1063 is placed over address lines 454. In particular, the pattern of photoresist covers the non-anodized portions of address lines 454. In one embodiment, the pattern of photoresist not only covers the non-anodized portions of address lines 454, but also covers a portion of the anodized portions of address lines 454.

Next, procedure 160 (FIG. 1) of removing the bus lines includes etching the bus lines. For example, if the bus lines comprise aluminum, procedure 160 comprises etching aluminum. The activity of etching the bus lines can be similar or identical to etching the metal layer of procedure 120 of providing the metal layer. For example, the bus lines can be etched using any known method of etching. As an example, the bus lines can be etched using an AMAT 8330. The anodized layer is particularly robust and can withstand the etching of the metal.

Figure 11:
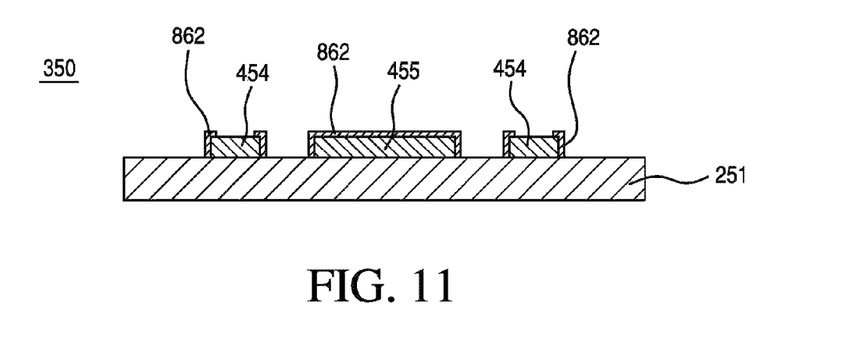
FIG. 11 illustrates a cross-sectional view of the semiconductor device of FIG. 3 after removing the bus lines, according to the first embodiment.

FIG. 11 illustrates a cross-sectional view of an example of semiconductor device 350 after procedure 160 (FIG. 1) of removing the bus lines, according to the first embodiment. Semiconductor device 350 comprises anodization layer 862 over gate 455 and portions of address lines 454. The bus lines and photoresist layer of procedure 160 are no longer present in semiconductor device 350.

Figure 12:
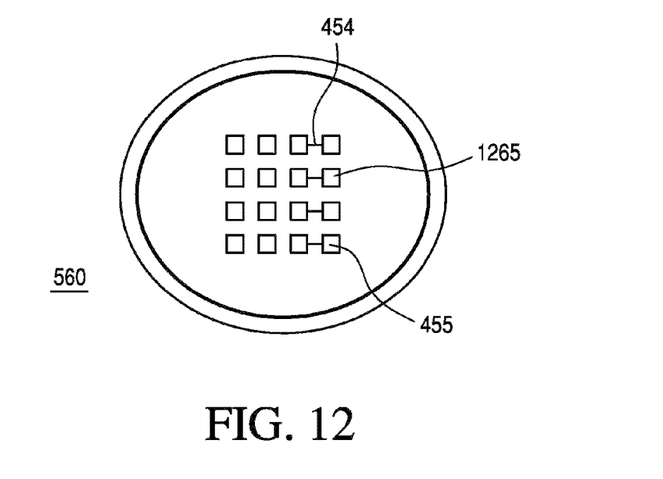
FIG. 12 illustrates a top view of the wafer of FIG. 5 after removing the bus lines, according to the first embodiment.

FIG. 12 illustrates a top view of an example of wafer 560 after removing the bus lines, according to the first embodiment. Wafer 560 comprises address lines 454 and gates 455. In addition, gate vias 1265 are located over some of gates 455.

Next, method 100 of FIG. 1 includes procedure 170 of providing one or more semiconductor elements. Procedure 170 can include a process of providing an active layer. The active layer can be any active layer used in semiconductor devices. In one example, the active layer comprises amorphous silicon (a-Si). In another example, the active layer can comprise pentacene. In another example, the active layer can comprise a zinc oxide, such as, for example, indium gallium zinc oxides (InGaZnO$_x$).

Once the active layer has been added to the semiconductor device, the anodization layer can act as a gate dielectric layer. The anodization layer, which comprises Al$_2$O$_3$ in some examples, can be used in place of a silicon nitride gate dielectric, which is commonly used in semiconductor devices. Al$_2$O$_3$ can be advantageous if used in place of silicon nitride. For example, Al$_2$O$_3$ has a higher band gap, a higher dielectric constant, and does not have to contain hydrogen. If the active layer comprises a zinc oxide, hydrogen can leak into the oxide, thus causing the active layer to shift operations, making the active layer conductive. Therefore, it can be advantageous to use Al$_2$O$_3$ as the gate dielectric if the active layer comprises an oxide.

The active layer can be deposited onto the semiconductor device using any known method for depositing an active layer. For example, if the active layer comprises amorphous silicon, the active layer can be deposited using PECVD. If the active layer comprises a-Si, a silicon nitride layer can be deposited between the Al$_2$O$_3$ layer and the a-Si layer.

If the active layer comprises a zinc oxide, the active layer can be deposited using atomic layer deposition or sputtering. After the active layer has been deposited on the semiconductor device, the active layer can be etched.

Figure 13:
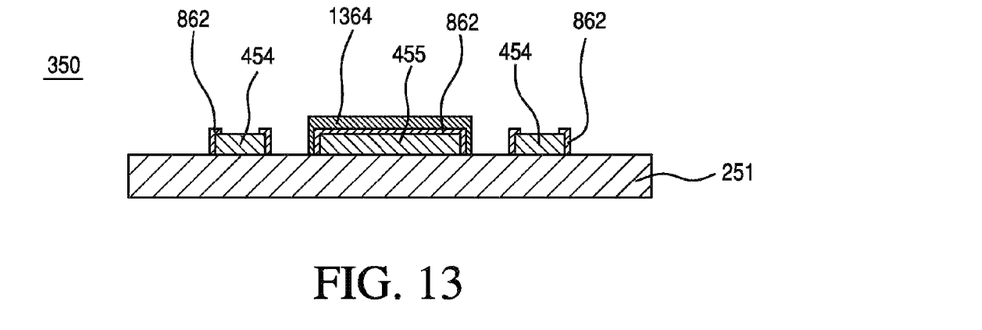
FIG. 13 illustrates a cross-sectional view of the semiconductor device of FIG. 3 after providing an active layer, according to the first embodiment.

FIG. 13 illustrates a cross-sectional view of an example of semiconductor device 350 after providing an active layer. Active layer 1364 is deposited and etched over anodization layer 862 and gate 455.

After providing the active layer, procedure 170 can include a process of providing a passivation layer. The passivation layer can comprise different elements, according to the composition of the active layer. For example, if the active layer comprises amorphous silicon, the passivation layer can comprise silicon nitride. If the active layer comprises a zinc oxide based material, the passivation layer can comprise silicon oxynitride.

The passivation layer can be deposited over the active layer using any known method. For example, if the passivation layer comprises silicon nitride, the passivation layer can be deposited using PECVD. In the same or different examples, the passivation layer can be deposited via PECVD using an AMAT P5000.

Figure 14:
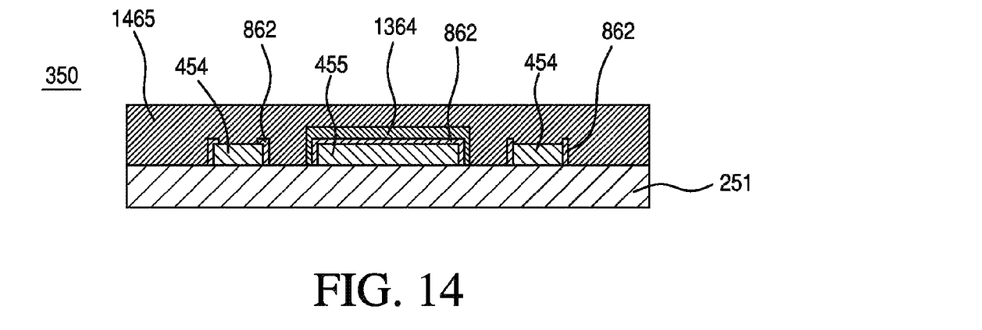
FIG. 14 illustrates a cross-sectional view of the semiconductor device of FIG. 3 after providing a passivation layer, according to the first embodiment.

FIG. 14 illustrates a cross-sectional view of an example of semiconductor device 350 after providing a passivation layer, according to the first embodiment. Passivation layer 1465 is deposited over active layer 1364, anodization layer 862, gate 455, and address lines 454. As an example, the passivation layer can be approximately 0.10 μm thick.

Subsequently, procedure 170 can include a process of pattern etching contact gate vias and source drain vias through the passivation layer. The contact gate vias and the source drain vias can be pattern etched in the same step. Alternatively, the contact gate vias can be pattern etched before the source drain vias. In another example, the source drain vias can be etched before the contact gate vias.

The contact gate vias and the source drain vias can be patterned etched into the passivation layer using any known method of etching. For example, if the passivation layer comprises silicon nitride, the etching of the contact gate vias and source drain vias can be accomplished using a Tegal 903, manufactured by Tegal Corporation of Petaluma, Calif.

Figure 15:
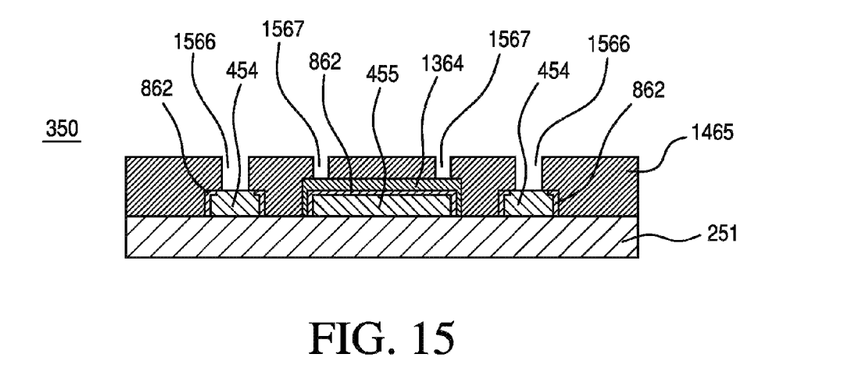
FIG. 15 illustrates a cross-sectional view of the semiconductor device of FIG. 3 after etching contact vias and source drain vias, according to the first embodiment.

FIG. 15 illustrates a cross-sectional view of an example of semiconductor device 350 after providing contact vias and source drain vias, according to the first embodiment. Contact vias 1566 are etched into passivation layer 1465 over address lines 454. Source drain vias 1567 are etched into passivation layer 1465 over active layer 1364. Gate vias in passivation layer 1465 are not shown in FIG. 15.

Next, procedure 170 (FIG. 1) can include a process of providing a source-drain metal layer. The source-drain metal layer can be deposited over the passivation layer and then pattern etched. In some examples, the source-drain metal layer can comprise a second metal layer and an N+ a-Si layer. In the same or other examples, source drain metal layer can also comprise a diffusion barrier between the N+ a-Si layer and the second metal layer.

The N+ a-Si layer can be provided by way of PECVD. As an example, the N+ a-Si layer can be approximately 0.05 μm thick. In the same or different embodiments, N+ a-Si layer can be deposited via PECVD using an AMAT P5000.

As an example, the diffusion barrier can include tantalum (Ta). In the same or different examples, the second metal layer can include aluminum (Al). The diffusion barrier can help prevent atoms from the second metal layer, such as, for example, Al particles, from diffusing into the N+ a-Si layer. The diffusion barrier and the second metal layer can be deposited over the N+ a-Si layer by way of sputtering. In some examples, the diffusion barrier and the second metal layer can be deposited using a KDF 744.

After, the N+ a-Si layer, the diffusion barrier, and the second metal layer have been deposited onto the semiconductor device, the three layers are etched. As an example, the three layers can be etched using an AMAT 8330. In some examples, the N+ a-Si layer, the diffusion barrier, and the metal layer are etched using a single recipe for all three of the layers.

Figure 16:
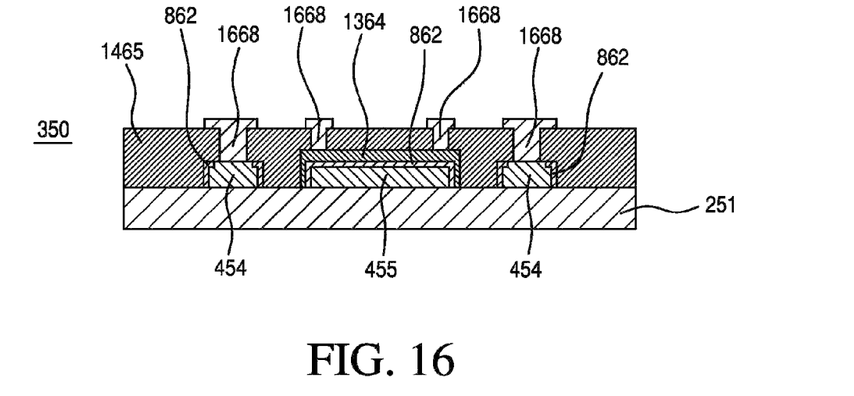
FIG. 16 illustrates a cross-sectional view of the semiconductor device of FIG. 3 after depositing and etching a source-drain metal layer, according to the first embodiment.

FIG. 16 illustrates a cross-sectional view of an example of semiconductor device 350 after providing the source-drain metal layer, according to the first embodiment. Source-drain metal layer 1668 fills the contact gate vias 1566 (FIG. 15) and the source drain vias 1567 (FIG. 15). Source-drain metal layer 1668 that fills contact vias 1566 (FIG. 15) is also located over address lines 454. Source-drain metal layer 1668 that fills source drain vias 1567 is also located over active layer 1364.

Although the invention has been described with reference to specific embodiments, it will be understood by those skilled in the art that various changes can be made without departing from the spirit or scope of the invention. Accordingly, the disclosure of embodiments is intended to be illustrative of the scope of the invention and is not intended to be limiting. It is intended that the scope of the invention shall be limited only to the extent required by the appended claims. To one of ordinary skill in the art, it will be readily apparent that the semiconductor device and its methods of providing the semiconductor device discussed herein may be implemented in a variety of embodiments, and that the foregoing discussion of certain of these embodiments does not necessarily represent a complete description of all possible embodiments. Rather, the detailed description of the drawings, and the drawings themselves, disclose at least one preferred embodiment, and may disclose alternative embodiments.

All elements claimed in any particular claim are essential to the embodiment claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method of providing a semiconductor device, comprising:
   providing a plastic substrate;
   depositing a metal layer over the plastic substrate;
   pattern etching the metal layer to form at least one bus line, at least one address line, and at least one gate;
   depositing a hard mask layer over the metal layer;
   anodizing the metal layer;
   removing the at least one bus line after anodizing the metal layer; and
   providing one or more semiconductor elements.

2. The method of claim 1, wherein:
   providing the plastic substrate comprises providing the plastic substrate comprising at least one of polyethylene naphthalate, polyethylene terephthalate, polyethersulfone, polyimide, polycarbonate, cyclic olefin copolymer, or liquid crystal polymer.

3. The method of claim 1, wherein:
   depositing the metal layer over the plastic substrate comprises depositing aluminum over the plastic substrate.

4. The method of claim 1, wherein:
   depositing the hard mask layer comprises depositing a silicon nitride layer mask layer.

5. The method of claim 1, further comprising:
   removing the hard mask layer after anodizing the metal layer.

6. The method of claim 1, wherein:
   providing the one or more semiconductor elements comprises depositing an active layer.

7. The method of claim 6, wherein:
   providing the one or more semiconductor elements further comprises depositing a passivation layer over the active layer.

8. The method of claim 7, wherein:
   providing the one or more semiconductor elements further comprises pattern etching the passivation layer to form one or more contact vias and one or more source drain vias.

9. The method of claim 1, wherein:
   providing the one or more semiconductor elements further comprises providing a source-drain metal layer.

10. The method of claim 9, wherein:
providing the source-drain metal layer comprises providing a N+ amorphous silicon layer and a second metal layer.

11. The method of claim 10, wherein:
providing the source-drain metal layer further comprises providing a diffusion barrier between the N+ amorphous silicon layer and the second metal layer.

12. A method of providing a semiconductor device, comprising:
providing a plastic substrate;
providing at least one bus line over the plastic substrate;
providing at least one address line over the plastic substrate;
providing at least one gate over astic substrate;
providing a hard mask layer over the at least one bus line and a portion of the at least one address line;
placing the plastic substrate in an electrolyte solution;
applying a current to the at least one bus line;
forming an anodization layer over the at least one gate and a portion of the at least one address line; and
providing at least one semiconductor element, wherein providing the at least one semiconductor element comprises at least one of:
providing an active layer;
providing a passivation layer; or
providing a source-drain metal layer.

13. The method of claim 12, wherein:
the electrolyte solution comprises:
69% by weight ethylene glycol;
30% by weight water; and
1% by weight tartaric acid.

14. The method of claim 12, wherein:
the electrolyte solution has a pH of approximately 7.

15. The method of claim 12, further comprising:
removing the at least one bus line after forming the anodization layer.

16. The method of claim 12, wherein:
providing the plastic substrate comprises providing the plastic substrate comprising at least one of polyethylene naphthalate, polyethylene terephthalate, polyethersulfone, polyimide, polycarbonate, cyclic olefin copolymer, or liquid crystal polymer.

* * * * *